(12) United States Patent
Syed et al.

(10) Patent No.: US 10,680,557 B2
(45) Date of Patent: *Jun. 9, 2020

(54) METHOD AND APPARATUS FOR USING BACK GATE BIASING FOR POWER AMPLIFIERS FOR MILLIMETER WAVE DEVICES

(71) Applicant: GLOBALFOUNDRIES INC., Grand Cayman (KY)

(72) Inventors: Shafiullah Syed, Richardson, TX (US); Abdellatif Bellaouar, Richardson, TX (US); Chi Zhang, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/367,113

(22) Filed: Mar. 27, 2019

(65) Prior Publication Data
US 2019/0267946 A1    Aug. 29, 2019

Related U.S. Application Data

(63) Continuation of application No. 15/908,678, filed on Feb. 28, 2018, now Pat. No. 10,291,183.

(51) Int. Cl.
*H03F 1/02* (2006.01)
*H03F 3/195* (2006.01)
(Continued)

(52) U.S. Cl.
CPC ......... *H03F 1/0211* (2013.01); *H03F 1/0261* (2013.01); *H03F 1/14* (2013.01); *H03F 3/195* (2013.01); *H03F 3/2171* (2013.01); *H04B 1/04* (2013.01); *H01L 21/84* (2013.01); *H01L 27/1203* (2013.01); *H03F 2200/451* (2013.01); *H03F 2200/534* (2013.01); *H03F 2200/541* (2013.01); *H03F 2203/45318* (2013.01); *H03F 2203/45342* (2013.01); *H03F 2203/45621* (2013.01); *H03F 2203/45731* (2013.01); *H04B 2001/0408* (2013.01)

(58) Field of Classification Search
USPC .......................................... 330/252–261, 311
See application file for complete search history.

(56) References Cited

U.S. PATENT DOCUMENTS

| | | | |
|---|---|---|---|
| 8,624,678 B2 * | 1/2014 | Scott | H03F 1/0272 330/285 |
| 8,729,962 B2 | 5/2014 | Lin et al. | |

(Continued)

*Primary Examiner* — Hieu P Nguyen
(74) *Attorney, Agent, or Firm* — Williams Morgan, P.C.

(57) ABSTRACT

An apparatus, comprising an input transformer; a first differential transistor pair configured to receive a first back gate bias voltage; a second differential transistor pair configured to receive a second back gate bias voltage; a cross-coupled neutralization cap comprising PMOS or NMOS transistors and configured to receive a third back gate bias voltage; and an output transformer. A method of fixing at least one back gate bias voltage to impart a desired capacitance to the transistors of at least one of the first differential transistor pair, the second differential transistor pair, or the neutralization cap. The apparatus and method may provide a power amplifier having improved linearity and efficiency.

19 Claims, 9 Drawing Sheets

(51) Int. Cl.
  *H04B 1/04* (2006.01)
  *H03F 3/45* (2006.01)
  *H03F 3/217* (2006.01)
  *H03F 1/14* (2006.01)
  *H01L 21/84* (2006.01)
  *H01L 27/12* (2006.01)

(56) References Cited

U.S. PATENT DOCUMENTS

| | | |
|---|---|---|
| 8,823,449 B2 | 9/2014 | Dieter et al. |
| 9,337,777 B2 * | 5/2016 | Kim ................ H03F 1/0261 |
| 9,413,309 B1 | 8/2016 | Zhao et al. |
| 9,979,362 B2 * | 5/2018 | Kang .................... H03F 1/56 |
| 2017/0098474 A1 * | 4/2017 | Tran .................... G11C 7/065 |

* cited by examiner

METHOD AND APPARATUS FOR USING BACK GATE BIASING FOR POWER AMPLIFIERS FOR MILLIMETER WAVE DEVICES

BACKGROUND OF THE INVENTION

Field of the Invention

Generally, the present disclosure relates to sophisticated semiconductor devices, and, more specifically, to power amplifiers for millimeter wave devices.

Description of the Related Art

Power amplification is a necessity in essentially all electronic devices. In light of the ongoing race to reduce device sizes and/or power consumptions, known power amplifiers have undesirably low efficiency and undesirably large size for use in contemporary devices. Related to this, know power amplifiers also have relatively low linearity over various voltage ranges. These problems are particularly pronounced for millimeter wave devices.

Also, different electronic devices may have different power amplification requirements, based on one or more of the intended use of the device, its available power, its desired power consumption, and the like. Known power amplifiers are generally designed specifically for a single electronic device and require redesign for use in a different electronic device. The state of the art generally lacks power amplifiers that may allow one or more of increased efficiency, increased linearity, reduced size, and/or increased ease of incorporating into one or more electronic devices.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to apparatus and methods of preparing the apparatus for use. In one embodiment, the present disclosure provides an apparatus comprising an input transformer; a first differential transistor pair comprising a first transistor, a second transistor, and a first direct current (DC) voltage source configured to provide a first back gate bias voltage to the first transistor and to the second transistor; a second differential transistor pair comprising a third transistor, a fourth transistor, and a second DC voltage source configured to provide a second back gate bias voltage to the third transistor and to the fourth transistor; a neutralization cap comprising a fifth transistor, a sixth transistor, and a third DC voltage source, wherein the fifth transistor and the sixth transistor are cross-coupled, the fifth transistor is a PMOS transistor, the sixth transistor is a PMOS transistor, and the third DC voltage source is configured to provide a third back gate bias voltage to the fifth transistor and the sixth transistor; and an output transformer.

In one embodiment, the present disclosure provides a method comprising forming an apparatus, such as is described herein; determining at least one of a first desired capacitance of a first differential transistor pair, a second desired capacitance of a second differential transistor pair, and a third desired capacitance of a neutralization cap; determining at least one of a first desired back gate bias voltage that, when applied to a first transistor and a second transistor, imparts the first desired capacitance to the first differential transistor pair; a second desired back gate bias voltage that, when applied to a third transistor and a fourth transistor, imparts the second desired capacitance to the second differential transistor pair; and a third desired back gate bias voltage that, when applied to a fifth transistor and a sixth transistor, imparts the third desired capacitance to the neutralization cap; and fixing at least one of a first DC voltage source such that a first back gate bias voltage is equal to the first desired back gate bias voltage; a second DC voltage source such that a second back gate bias voltage is equal to the second desired back gate bias voltage; and a third DC voltage source such that a third back gate bias voltage is equal to the third desired back gate bias voltage.

Embodiments herein may provide a power amplifier with improved linearity, improved efficiency, and/or reduced size. Embodiments herein may also provide a "drop-in" power amplifier which can have its efficiency and/or linearity set to a desired value based on the intended use and other parameters of an electronic device into which it is to be incorporated.

BRIEF DESCRIPTION OF THE DRAWINGS

The disclosure may be understood by reference to the following description taken in conjunction with the accompanying drawings, in which like reference numerals identify like elements, and in which.

Figure 1:
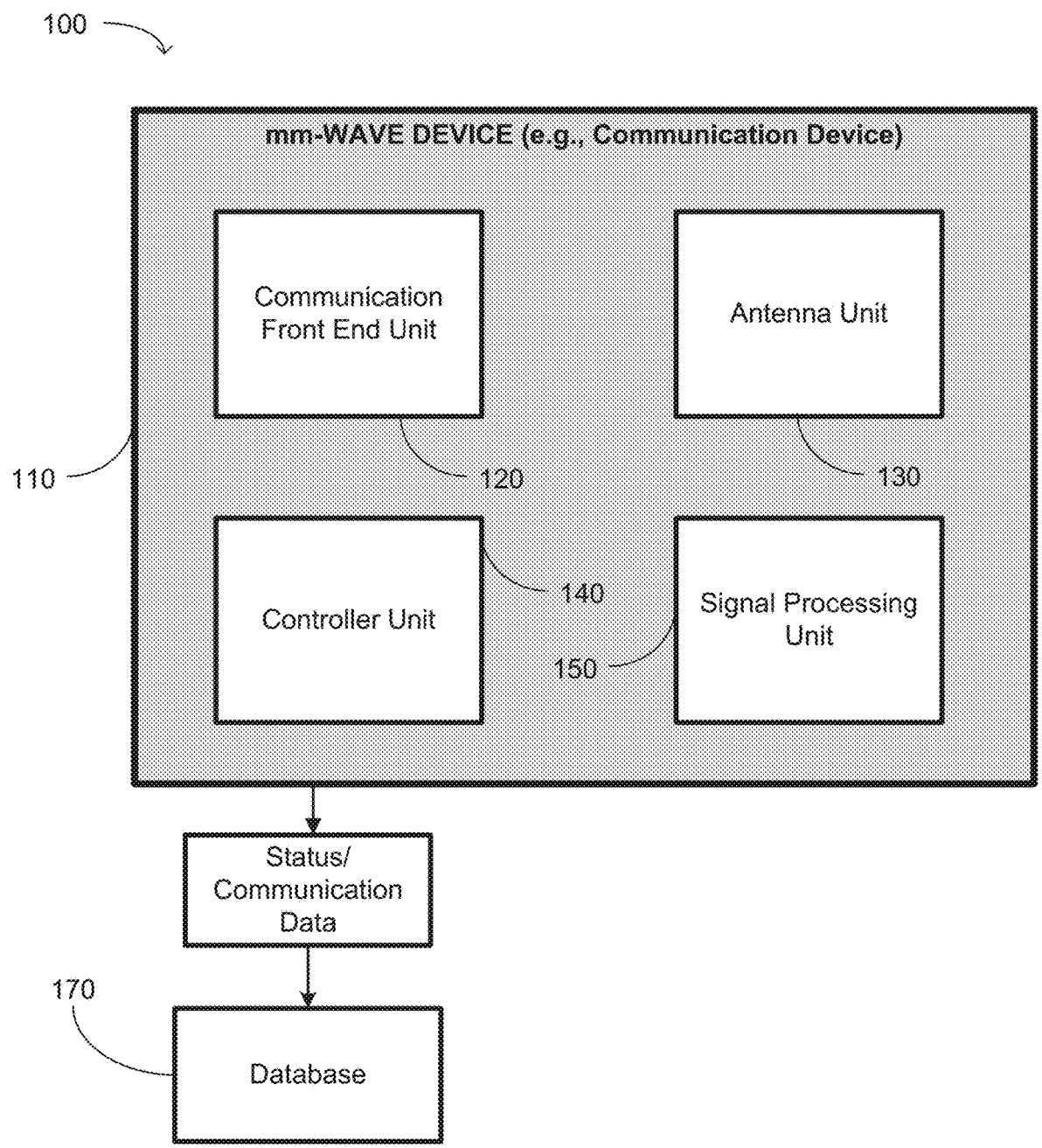
FIG. 1 illustrates a stylized block diagram representation of a mm-wave communication system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for millimeter wave (mm-wave) power amplifiers with improved linearity and efficiency. Other embodiments herein allow for the tuning of various properties of the power amplifier to improve linearity and efficiency for specific intended uses of the power amplifier and a device comprising the power amplifier.

For ease of illustration, embodiments herein is depicted within the context of a 5G communication device, however, those skilled in the art would readily appreciate that the concepts disclosed herein may be implemented in other types of devices, such as radar devices, other high-speed communication devices, network devices, etc. Turning now to FIG. 1, a stylized block diagram representation of a communication system, in accordance with embodiments herein, is illustrated.

A system 100 may comprise a millimeter wave (mm-wave) device 110 and a database 170. The mm-wave device 110 may be a communication device, such as a 5G or WiGig communication device, or in alternative embodiments (not shown) a radar device, a data network device, a video device, or the like. For illustrative purposes and for the sake of clarity and ease of description, the mm-wave device 110 is described in the context of a 5G or WiGig communication application; as such, the mm-wave device 110 may be often referred to below as a communication device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The communication device 110 is capable of transmitting a first communication signal, receiving a second communication signal, and processing the second communication signal.

The communication device 110 may comprise a communication front end unit 120, an antenna unit 130, a controller unit 140, and a signal processing unit 150. The communication front end unit 120 may comprise a plurality of components, circuit, and/or modules, and is capable of sending, receiving, and processing communication signals. In one embodiment, the communication device 110 may be encompassed into a single integrated circuit (IC) chip. In some embodiments, the communication device 110 may be formed on a plurality of integrated circuits that are positioned on a single IC chip. In other embodiments, communication device 110 may be formed on single integrated circuit, which is shrouded into an IC chip.

The communication front end unit 120 is capable of providing an output signal, e.g., a first communication signal. In one embodiment, the frequency range of the communication signals processed by the communication device 110 may be in the range of about 10 GHz to about 90 GHz, such as, for example, 28 GHz or 40 GHz. A more detailed description of the communication front end unit 120 is provided in FIG. 3 and accompanying description below.

In an embodiment, the communication front end unit 120 may be a network communications front end unit. In this embodiment, the communication device 110 may process network communications for various types of communication applications, such as packet data network communications, wireless (e.g., cellular communications, IEEE 802.11ad WiGig Technology, etc.), data communications, etc. The concepts disclosed herein may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the first communication signal, while the receiver antennas are used for receiving a second communication signal. A more detailed description of the antenna unit 130 is provided in FIG. 7, and accompanying description below.

Continuing referring to FIG. 1, the communication device 110 may also comprise a signal processing unit 150. The signal processing unit is capable of performing various analog and/or digital processing of the signals that are transmitted and/or received by the communication device 110. For example, the first communication signal transmitted by the communication device may be amplified prior to its transmission. Further, the second communication signal received by the communication device 110 may be sent through one or more analog filter stages. The second communication signal may then be converted to a digital signal by one or more analog-to-digital converters (DAC) in the signal processing unit 150. Digital signal processing (DSP) may be performed on the digitized signal. A more detailed description of the signal processing unit 150 is provided in FIG. 6 and accompanying description below.

Continuing referring to FIG. 1, the communication device 100 may also comprise a controller unit 140. The controller unit 140 may perform various control operations of the communication device 110. These functions include generating a first communication signal, transmitting the first communication signal, receiving a second communication signal, and processing the second communication signal.

Figure 2:
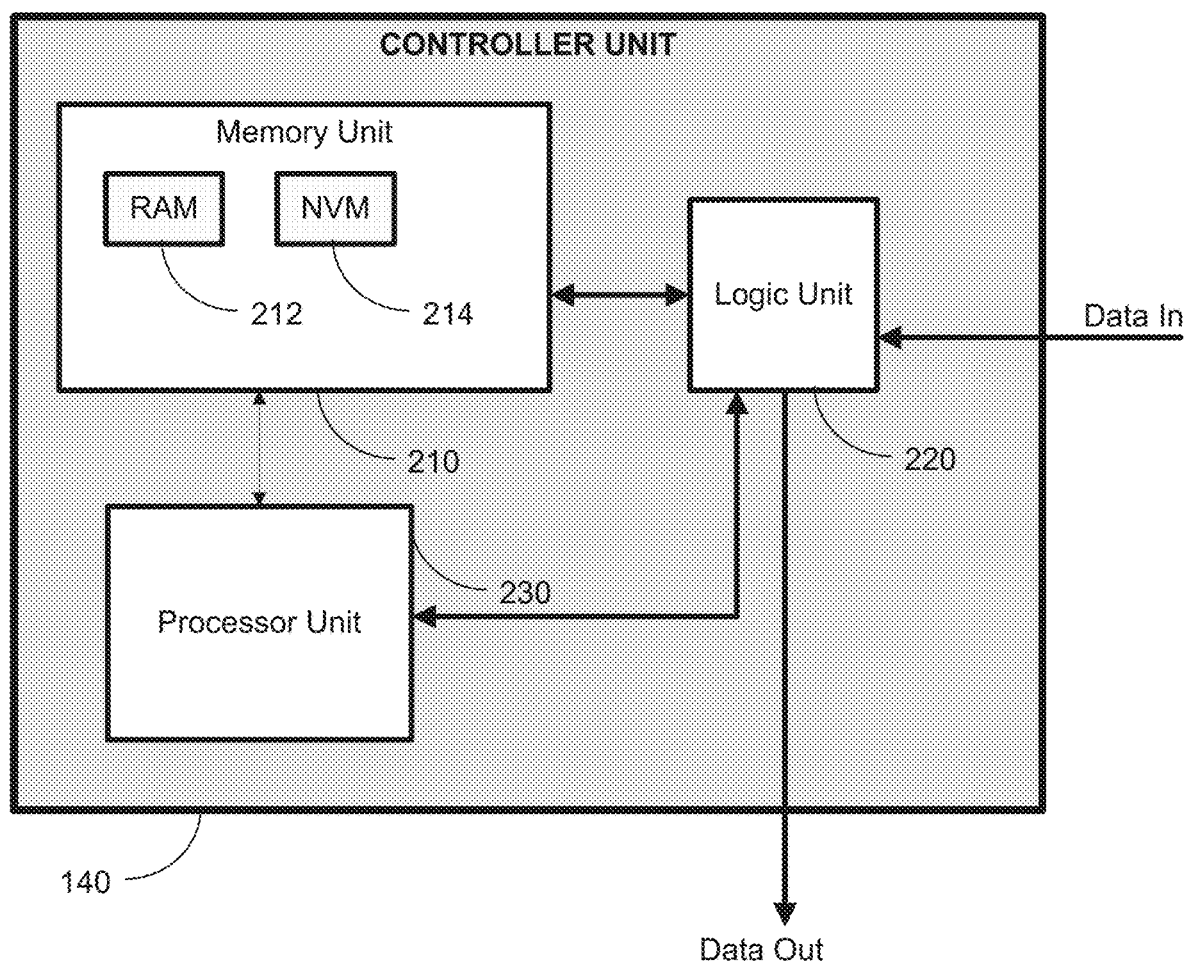
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the communication device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing the second communication signal. The data_out signal may represent data generated for the first communication signal.

The controller unit 140 may also comprise a memory unit 210. The memory unit 210 may comprise a non-volatile memory (NVM) 214 and a random access memory (RAM) 212. The non-volatile memory 214 may comprise FLASH memory and/or programmable read only (PROM) devices. The memory unit 210 is capable of storing operation parameters for controlling operations of the communication device 110. The memory unit 210 may also store data that may be used to program any FPGA devices in the communication device 110. As such, the memory unit 210 may be subdivided into a program data memory, a status data memory, and a reaction data memory. This subdivision may be performed logically, or physically.

Figure 3:
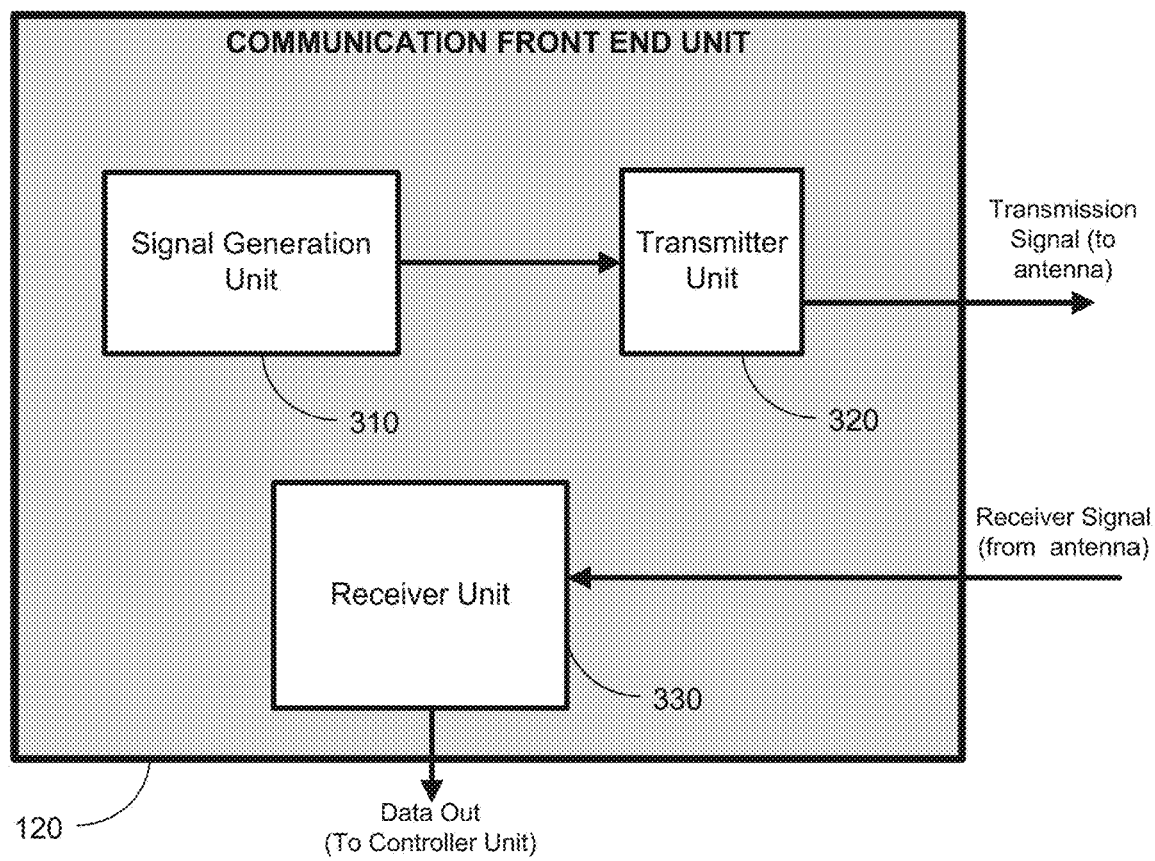
FIG. 3 illustrates a stylized block diagram depiction of the communication front end unit of FIG. 1, in accordance with embodiments herein, is illustrated.

Turning now to FIG. 3, a stylized block diagram depiction of the communication front end unit 120, in accordance with embodiments herein, is illustrated. The communication front end unit 120 may comprise a signal generation unit 310, a transmitter unit 320, and a receiver unit 330. The signal generation unit 310 is capable of generating a communication signal at a predetermined frequency. For example, a signal in the range of about 28 GHz to about 40 GHz may be generated. The signal generation unit 310 may comprise a true differential frequency doubler (FD). The FD may be formed in a push-push configuration. The signal generation unit 310 is capable of providing a communication signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a communication signal to be transmitted to the antenna unit 130.

Figure 4:
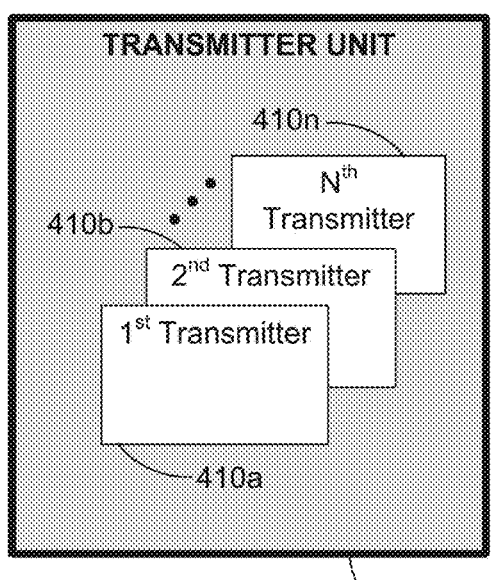
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410$a$, a $2^{nd}$ transmitter 410$b$, through an $N^{th}$ transmitter 410$n$ (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^4$ transmit signal for a first set of transmitters 410 and a $2^{nd}$ transmit signal for a second set of transmitters 410.

Continuing referring to FIG. 3, a received signal (i.e., a second communication signal) is provided to the receiver unit 330. The receiver unit 330 is capable of receiving the second communication signal from the antenna. The receiver unit 330 is capable of performing analog-to-digital (A/D) conversion, signal buffering, DSP, etc. In some embodiments, the signal processing unit 130 may perform A/D conversions and DSP and provide the processed signal to the receiver unit 330; however, in other embodiments, these tasks may be performed by the receiver unit 330. The receiver unit 330 is capable of directing data_out to the controller unit 140.

Figure 5:
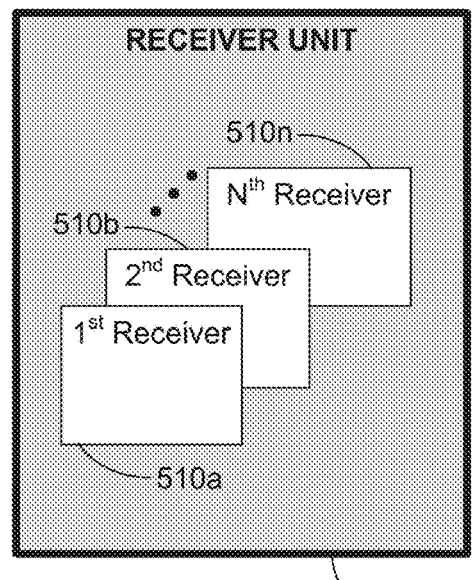
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510$a$, a $2^{nd}$ receiver 510$b$, through an $N^{th}$ receiver 510$n$ (collectively "510"). In one embodiment, the $1^{st}$ through $N^{th}$ receiver 510 may each process a single signal from the signal generation unit 310 and provide the signal to the controller unit 140. In another embodiment, the antenna unit 130 may provide a plurality of signals to the $1^{st}$ through $N^{th}$ receiver 510. For example, the antenna unit 130 may provide a signal to each receiver 510, or alternatively, a $1^4$ receiver signal for a first set of receivers 510 and a $2^{nd}$ receiver signal for a second set of receivers 510.

Figure 6:
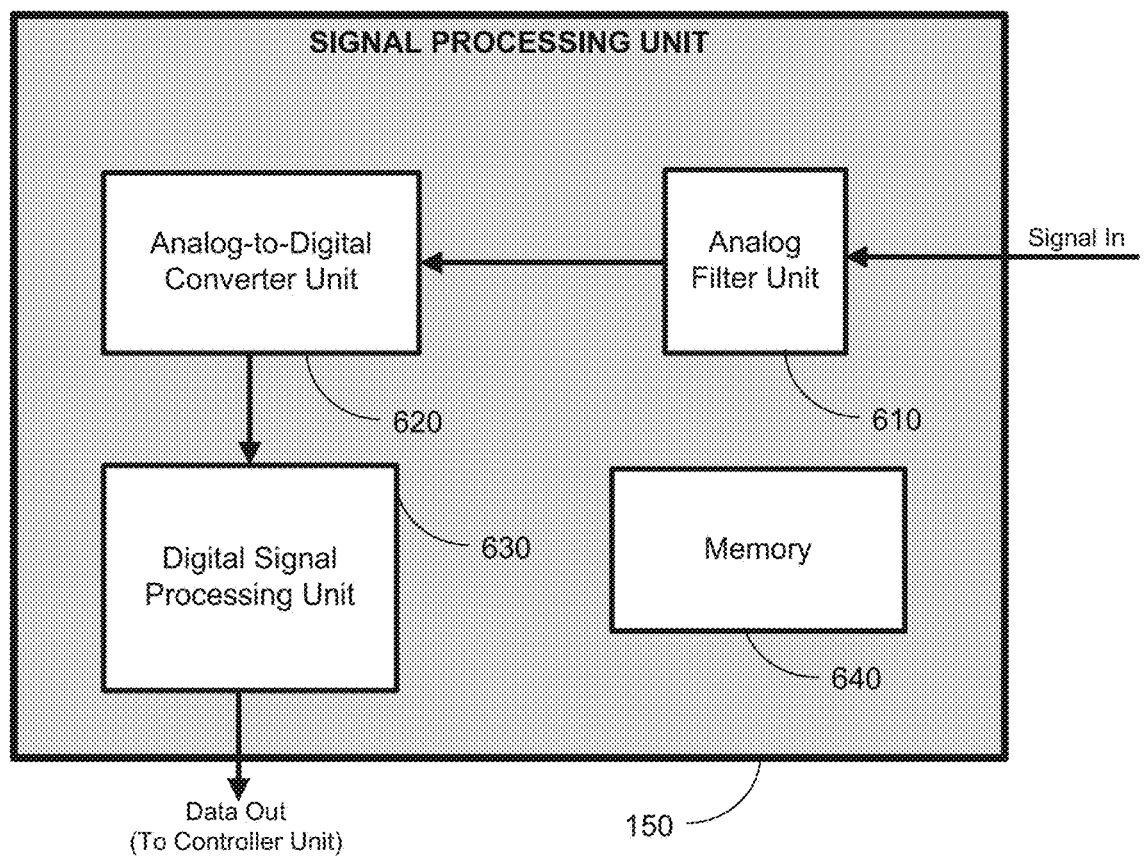
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
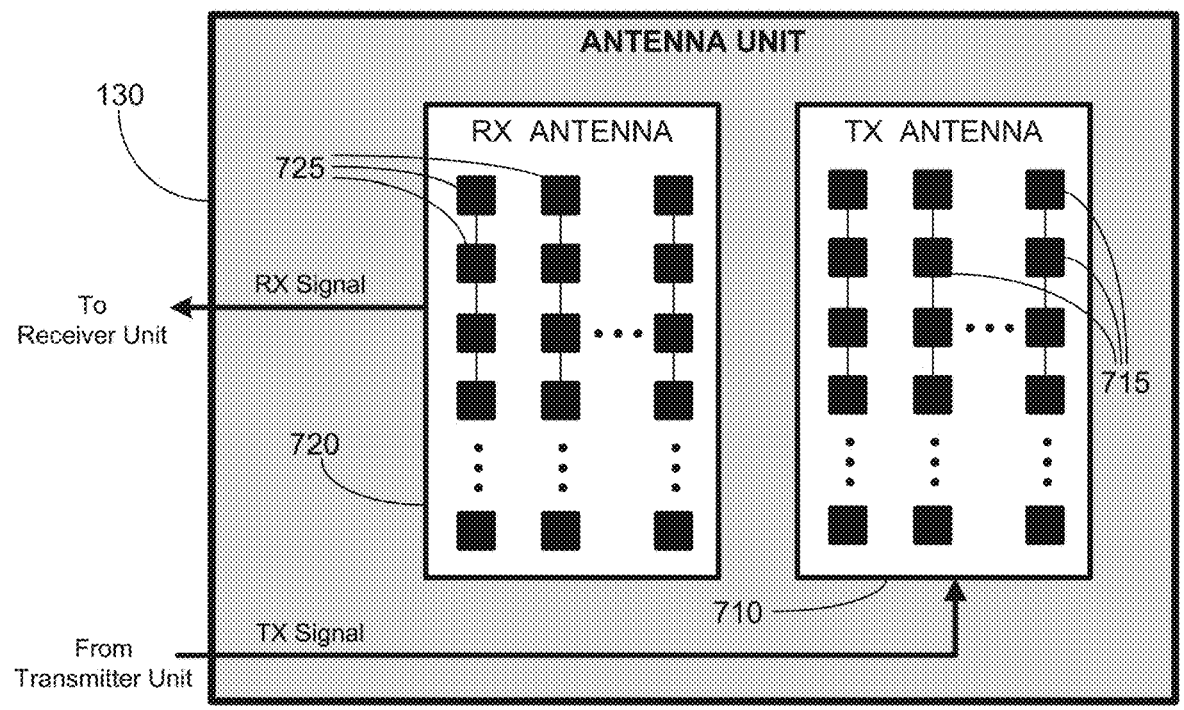
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
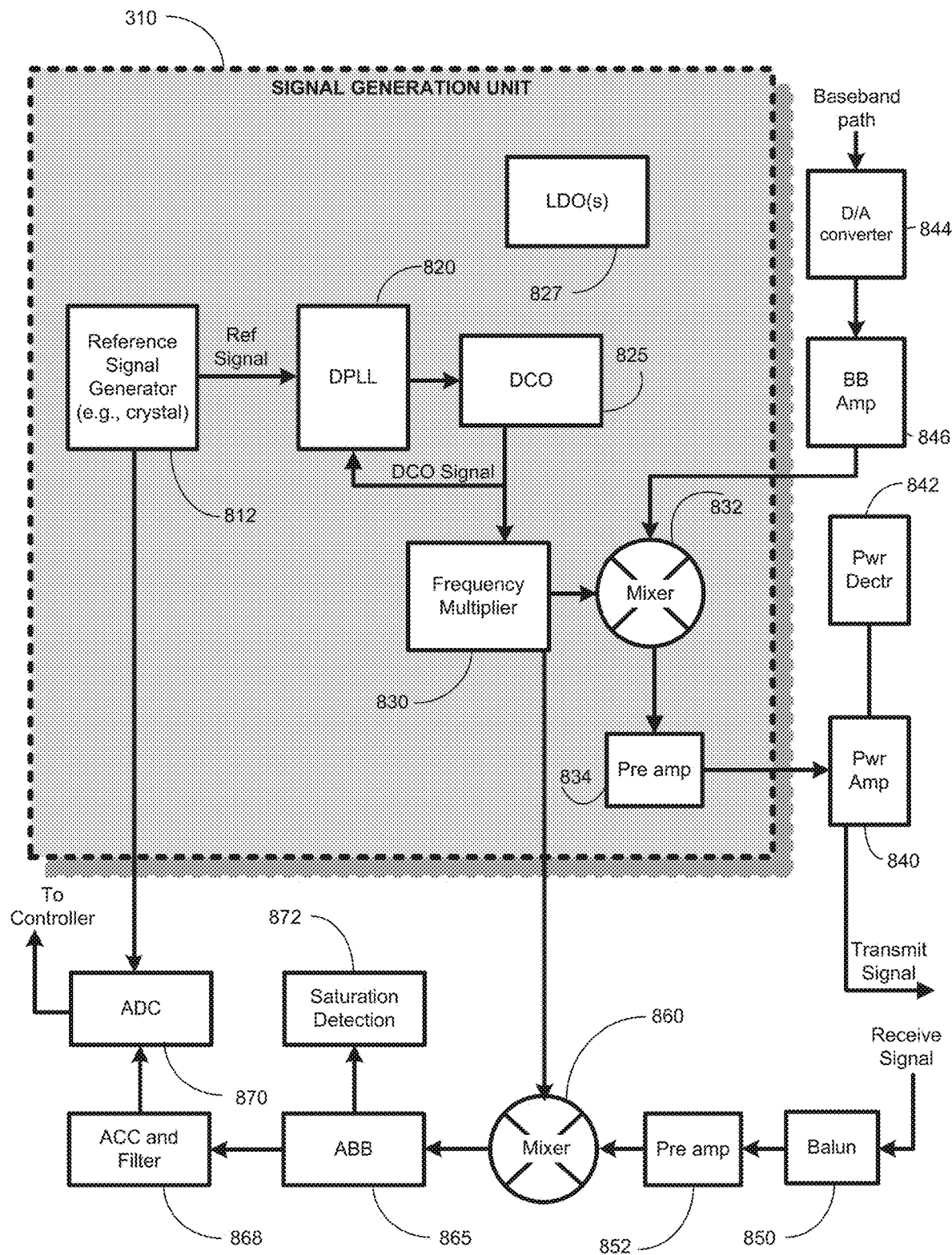
FIG. 8 illustrates a stylized block diagram depiction of an exemplary communications application of the system of FIG. 1, in accordance with embodiments herein.

Turning now to FIG. 8, a stylized block diagram depiction of an exemplary communication application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a first communication signal) that is to be transmitted.

A reference signal is provided by a reference signal generator 812. The reference signal is sent to a digital phase lock loop (DPLL) 820. The DPLL 820 locks the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 14 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit a 28 GHz or an about 40 GHz signal, for example in a communication application. The DCO 825 may provide a 14 GHz signal, therefore, frequency multiplying may be required to provide a 28 GHz or an about 40 GHz signal to transmit. Accordingly, a frequency multiplier 830 may be used to multiply the frequency provided by the DCO 825 to yield the desired output frequency. The output of the frequency multiplier 830 is mixed by mixer 832 with a baseband path signal provided by D/A converter 844 and baseband amp 846. The output of mixer 832 is provided to pre amp 834, and subsequently provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from the frequency multiplier 830. The output of the frequency multiplier 830 may be a reference signal having a desired reference frequency. The mixer 860 receives the reference signal and in one embodiment, multiplies it to the received communication signal.

In one embodiment, the frequency multiplier 830 may be a fully differential push-push frequency doubler.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

Figure 9:
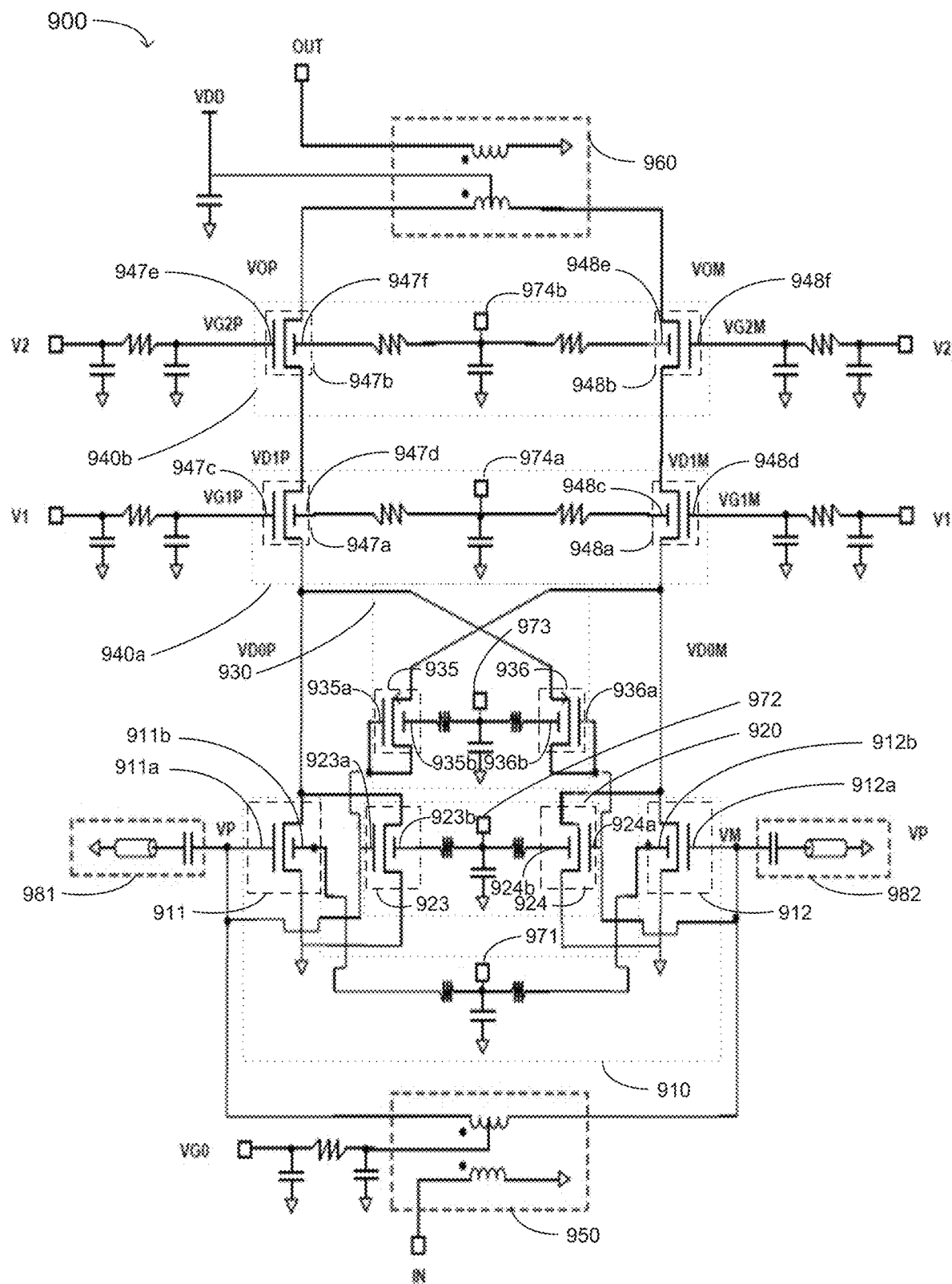
FIG. 9 illustrates a first power amplifier, in accordance with embodiments herein.

FIG. 9 depicts a first power amplifier 900, in accordance with embodiments herein. The first power amplifier 900 comprises an input transformer 950 and an output transformer 960. The input transformer 950 receives an input signal, IN, and transforms it to differential signals, VP and VM. The output transformer 960 receives amplified differential signals, VOP and VOM, and transforms them to output signal OUT. As depicted, the input transformer 950 is connected to ground, and the output transformer 960 is connected to VDD. The output signal OUT may be provided to the antenna unit 130 (FIGS. 1 and 7), wherein the output signal may be transmitted via the transmit antenna 710.

Various transistors provided by embodiments herein may each include a front gate and a back gate. The back gates may be used to affect the biasing of the transistor. In one embodiment, the transistors that include the back gates may be formed using fully depleted silicon on insulator (FDSOI) processes.

The first power amplifier 900 also comprises a first differential transistor pair 910. The first differential transistor pair 910 comprises a first transistor 911 and a second transistor 912. The $1^{st}$ transistor 911 includes a front gate 911a and a back gate 911b. The $2^{nd}$ transistor 912 includes a front gate 912a and a back gate 912b. The first differential transistor pair 910 may be a class A-B transistor pair, as known in the power amplifier art. As depicted, the gate of the first transistor 911 is controlled by a first differential signal, VP from input transformer 950 and the gate of the second transistor 912 is controlled by a second differential signal VM from input transformer 950. The first transistor 911 relays the first differential signal along VDOP and the second transistor 912 relays the second differential signal along VDOM.

The first differential transistor pair 910 also comprises a first direct current (DC) voltage source 971. The first DC voltage source 971 is configured to provide a first back gate bias voltage to the first transistor 911 (to the back gate 911b) and to the second transistor 912 (to the back 912b). By fixing the first DC voltage source 971 to a particular voltage, the back bias voltages provided to the back gates 911b, 912b of the first transistor 911 and the second transistor 912 may be set to a value providing improved linearity and/or efficiency of the power amplifier 900. Generally, in embodiments wherein the first differential transistor pair 910 is a class A-B transistor pair, adjusting the back bias voltages of the first transistor 911 and the second transistor 912 changes the bias point of the first power amplifier 900, and improves performance and reduces power consumption. For example, the first DC voltage source 971 may be fixed to a voltage of about 0.2 V.

The first power amplifier 900 also comprises a second differential transistor pair 920 comprising a third transistor 923 and a fourth transistor 924. The $3^{rd}$ transistor 923 includes a front gate 923a and a back gate 923b. The $4^{th}$ transistor 924 includes a front gate 924a and a back gate 924b. The second differential transistor pair 920 may be a class C transistor pair, as known in the power amplifier art. As depicted, the gate of the third transistor 923 is controlled by a first differential signal, VP from input transformer 950 and the gate of the fourth transistor 924 is controlled by a second differential signal, VM from input transformer 950. The third transistor 923 relays the first differential signal along VDOP and the second transistor 924 relays the second differential signal along VDOM.

The second differential transistor pair 920 also comprises a second DC voltage source 972 configured to provide a second back gate bias voltage to the third transistor 923 (to the back gate 923b) and to the fourth transistor 924 (to the back gate 924b). By fixing the second DC voltage source 972 to a particular voltage, the back bias voltages provided to the back gates 911b, 912b of the third transistor 923 and the fourth transistor 924 may be set to a value providing improved linearity and/or efficiency of the power amplifier 900, and improves performance and reduces power consumption. For example, the second DC voltage source 972 may be fixed to a voltage of about 0 V.

The first power amplifier 900 also comprises a neutralization cap 930 includes a fifth transistor 935 and a sixth transistor 936. The $5^{th}$ transistor 935 includes a front gate 935a and a back gate 935b. The $6^{th}$ transistor includes a front gate 936a and a back gate 935b. The neutralization cap 930 also comprises a third DC voltage source 973, configured to provide a third back gate bias voltage to the fifth transistor 935 and the sixth transistor 936. By fixing the third DC voltage source 973 to a particular voltage, the back bias voltages of the fifth transistor 935 (to the back gate 935b) and the sixth transistor 936 (to the back gate 936b) may be set to a value providing improved linearity and/or efficiency of the power amplifier 900. Generally, in embodiments wherein the second differential transistor pair 920 is a class C transistor pair, increasing the input power increases the gain of the first power amplifier 900 at lower back bias voltages as compared to the class-AB transistor pair whose gain decreases with an increase in input power Adjusting the back gate bias voltage of the class-AB pair and the class-C pair can help increase the flat power gain region to a higher input power level, thereby helping minimize AM-AM Fixing the third DC voltage source 973 to a particular voltage may also minimize AM and PM in the power amplifier 900, as the capacitance of the PMOS pair is balance to the capacitance of the complementary input NMOS pair, thereby reducing the variation in input capacitance. For example, the third DC voltage source 973 may be fixed to a voltage from about 1 Volt (V) to about 5 V.

In the neutralization cap 930, the fifth transistor 935 and the sixth transistor 936 are cross-coupled. In other words, the source of the fifth transistor 935 is connected to the same differential signal as the drain of the sixth transistor 936, and the source of the sixth transistor 936 is connected to the same differential signal as the drain of the fifth transistor 935.

In the neutralization cap 930 of the present embodiment, the fifth transistor 935 may be an NMOS transistor and the sixth transistor 936 may be an NMOS transistor. In embodiments wherein the fifth transistor 935 and the sixth transistor 936 are each NMOS transistors, reducing the back gate voltage provided by the third DC voltage source 973 may reduce the capacitance of the first power amplifier 900.

In one embodiment, such as is depicted in FIG. 9, the first power amplifier 900 may further comprise a first harmonic trap 981 connected to VP and a second harmonic trap 982 connected to VM. The first harmonic trap 981 and the second harmonic trap 982 may allow the power amplifier 900 to more effectively dampen variations of input voltages.

In one embodiment, such as is depicted in FIG. 9, the first power amplifier 900 may further include a stacked transistor pair 940a and a stacked transistor pair 940b. The transistor pair 940a comprises a seventh transistor 947a and an eighth transistor 948a. The $7^{th}$ transistor 947a includes a front gate 947c and a back gate 947d. The $8^{th}$ transistor 948a includes a front gate 948c and a back gate 948d. The transistor pair 940b comprises a $9^{th}$ transistor 947b and an $10^{th}$ transistor 948b. The $9^{th}$ transistor 947b includes a front gate 947e and a back gate 947f. The $10^{th}$ transistor 948b includes a front gate 948e and a back gate 948f. The FIG. 9 also includes a fourth DC voltage source 974 configured to provide a fourth back gate bias voltage to the seventh transistor 947 and the eighth transistor 948. The back gates described herein provides for back gate biasing of transistor having back gates.

By respectively applying predetermined voltages from the voltage sources 974a, 974b to the back gates of at least one of the stacked transistor pairs 940a, 940b, the power amplifier 900 may be more effective at handling higher voltage signals. Fixing the fourth DC voltage sources 974a, 947b to a particular voltage may also minimize AM and PM in the power amplifier 900.

The first transistor 911, the second transistor 912, the third transistor 923, the fourth transistor 924, the fifth transistor 935, the sixth transistor 936, the seventh transistor 947a, the eight transistor 948a, the ninth transistor 947b, and the tenth transistor 948b may have any architecture known in the art. In one embodiment, the first transistor 911, the second transistor 912, the third transistor 923, the fourth transistor 924, the fifth transistor 935, the sixth transistor 936, the seventh transistor 947a, the eight transistor 948a, the ninth transistor 947b, and the tenth transistor 948b is each an FDSOI transistor.

Figure 10:
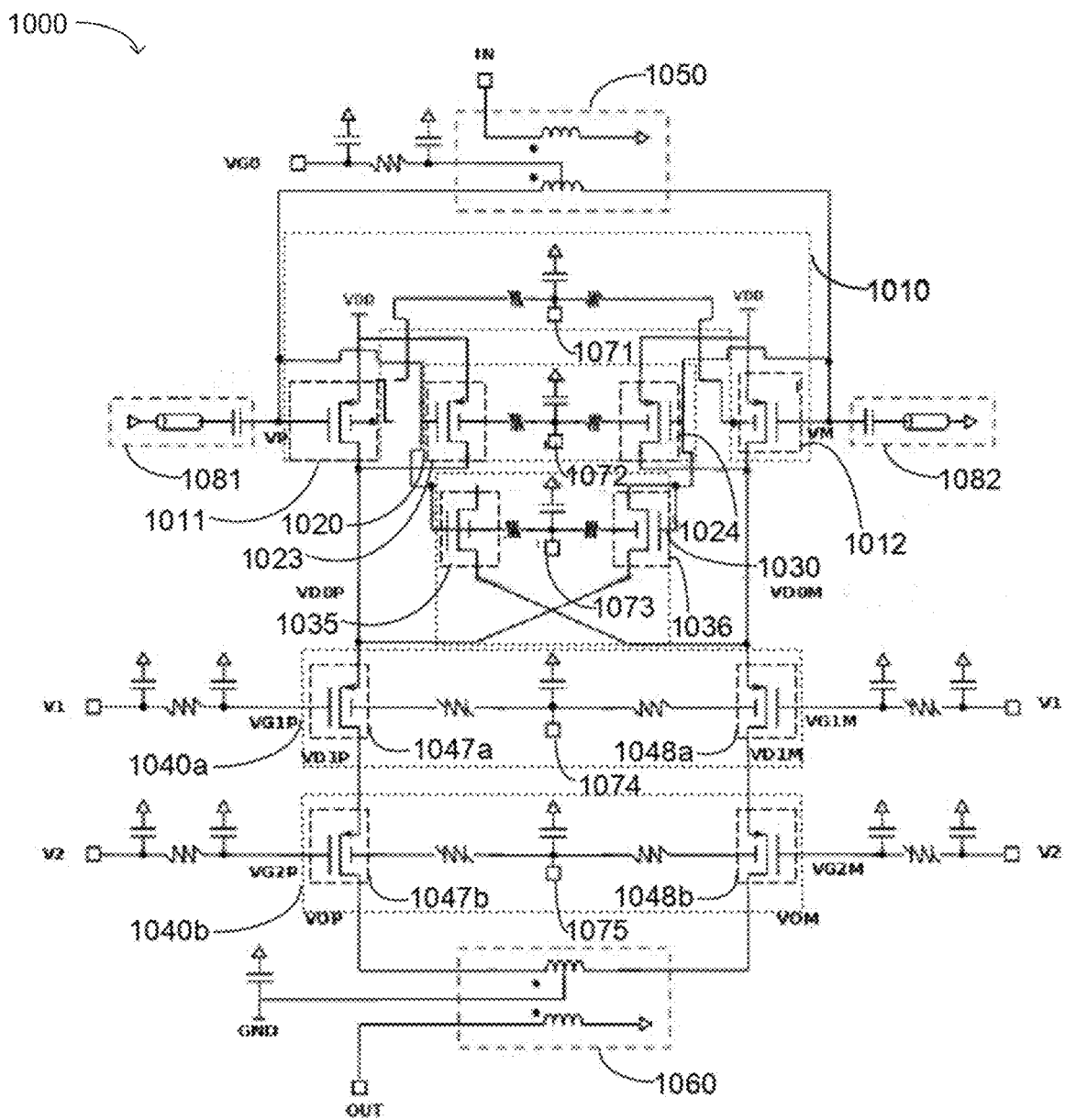
FIG. 10 illustrates a second power amplifier, in accordance with embodiments herein.

FIG. 10 depicts a second power amplifier 1000, in accordance with embodiments herein. Many elements of the second power amplifier 1000 are similar to elements of the first power amplifier 900. The reference numerals of similar elements will have the same tens and ones digits between FIG. 9 and FIG. 10, and will differ whether the leading digit(s) are "9" or "10," respectively. Where similar elements have similar structural features or perform similar functions, the elements depicted in FIG. 10 will not be described in detail, and the reader will be referred to the discussion of FIG. 9.

The second power amplifier 1000 comprises an input transformer 1050 and an output transformer 1060. As depicted, the input transformer 1050 is connected to VG0, and the output transformer 1060 is connected to ground.

The second power amplifier 1000 also comprises a first differential transistor pair 1010. The first differential transistor pair 1010 comprises a first transistor 1011 and a second transistor 1012. The $1^{st}$ and $2^{nd}$ transistors 1011 each include a front gate and a back gate, allowing for back gate biasing.

The first differential transistor pair 1010 also comprises a first DC voltage source 1071. The first DC voltage source 1071 is configured to provide a first back gate bias voltage to the first transistor 1011 and to the second transistor 1012. In one embodiment, the first DC voltage source 1071 may be fixed to a voltage of about 0 V.

The second power amplifier 1000 also comprises a second differential transistor pair 1020 comprising a third transistor 1023 and a fourth transistor 1024. The $3^{rd}$ and $4^{th}$ transistors 1011 each include a front gate and a back gate, allowing for back gate biasing.

The second differential transistor pair 1020 also comprises a second DC voltage source 1072 configured to provide a second back gate bias voltage to the third transistor 1023 and to the fourth transistor 1024. In one embodiment, the second DC voltage source 1072 may be fixed to a voltage of about 0 V.

The second power amplifier 1000 also comprises a neutralization cap 1030 comprising a fifth transistor 1035 and a sixth transistor 1036. The $5^{th}$ and $6^{th}$ transistors 1011 each include a front gate and a back gate, allowing for back gate biasing. The neutralization cap 1030 also comprises a third DC voltage source 1073. In one embodiment, the third DC voltage source 1073 may be fixed to a voltage from about 1 V to about 5 V.

In the neutralization cap 1030 of the present embodiment, the fifth transistor 1035 may be a PMOS transistor and the sixth transistor 1036 may be a PMOS transistor. In embodiments wherein the fifth transistor 1035 and the sixth transistor 1036 are each PMOS transistors, increasing the back gate voltage provided by the third DC voltage source 1073 may reduce the capacitance of the second power amplifier 1000.

In one embodiment, such as is depicted in FIG. 10, the second power amplifier 1000 may further comprise a first harmonic trap 1081 and a second harmonic trap 1082 connected to VM.

In one embodiment, such as is depicted in FIG. 10, the second power amplifier 1000 may further comprise at least one stacked transistor pair 1040, wherein each stacked transistor pair 1040 comprises a seventh transistor 1047 and an eighth transistor 1048. The $7^{th}$ and $8^{th}$ transistors 1047, 1048 each include a front gate and a back gate. The amplifier 1000 may also include a fourth DC voltage source 1074 configured to provide a fourth back gate bias voltage to the back gates of the seventh transistors 1047a, 1047b and the eighth transistors 1048a, 1048b. For example, FIG. 10 depicts two stacked transistor pairs 1040a, 1040b. The $7^{th}$ transistors 1047a, 1047b, and the $8^{th}$ transistors 1048a, 1048b each include a front gate and a back gate, allowing for back gate biasing.

In one embodiment, the first transistor 1011, the second transistor 1012, the third transistor 1023, the fourth transistor 1024, the fifth transistor 1035, the sixth transistor 1036, seventh transistors 1047a are each an FDSOI transistor.

Figure 11:
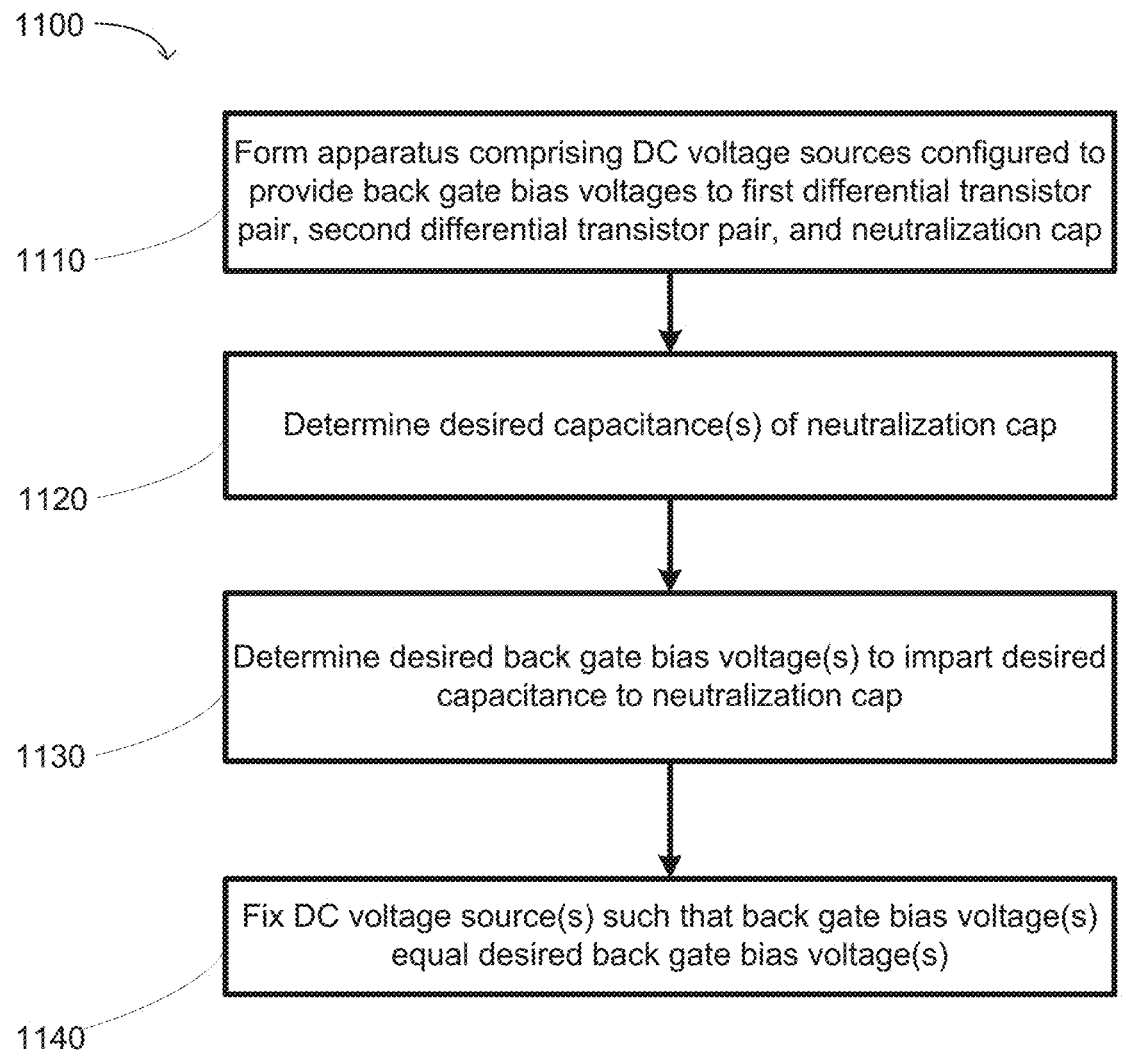
FIG. 11 illustrates a method, in accordance with embodiments herein.

FIG. 11 provides a flowchart of a method 1100, in accordance with embodiments herein. As depicted, the method 1100 comprises forming (at 1110) an apparatus such as a power amplifier 900 as depicted in FIG. 9, a power amplifier 1000 as depicted in FIG. 10, or a device comprising a power amplifier 900 or 1000.

The method 1100 also comprises determining (at 1120) a desired capacitance of a neutralization cap (e.g., neutralization cap 930, 1030) of the apparatus (e.g., power amplifier 900, 1000). The person of ordinary skill in the art having the benefit of the present disclosure may determine the desired capacitance of the neutralization cap as a routine matter, bearing in mind the expected range of parameters of an input signal to the apparatus, the desired range of parameters of an output signal of the apparatus, and other properties desired based on the expected use of a device comprising the apparatus.

The method 1100 also comprises determining (at 1130) a desired back gate bias voltage that, when applied to a fifth transistor and a sixth transistor, imparts the desired capacitance to the neutralization cap. The person of ordinary skill in the art having the benefit of the present disclosure, and having determined the desired capacitance, may determine the desired back gate voltage as a routine matter.

In one embodiment, the desired back gate bias voltage is from about 1 V to about 5 V.

The method 1100 also comprises selecting and/or fixing (at 1140) a third DC voltage source such that a third back gate bias voltage applied to the fifth transistor and the sixth transistor is equal to the third desired back gate bias voltage.

In a further embodiment, the method 1100 may also comprise determining a desired efficiency of the apparatus. The method 1100 may subsequently comprise determining a desired back gate bias voltage that, when applied to the first transistor and the second transistor, or the third transistor and the fourth transistor, or to all four of the first through fourth transistors, imparts the desired efficiency to the apparatus. The method 1100 may further comprise fixing the first DC voltage source, the second DC voltage source, or both such that the back gate bias voltage provided to the various of the first through fourth transistors is equal to the desired back gate bias voltage that imparts the desired efficiency to the apparatus.

In an additional further embodiment, wherein the apparatus further comprises at least one stacked transistor pair, wherein each stacked transistor pair comprises a seventh transistor, an eighth transistor, and a fourth DC voltage source configured to provide a fourth back gate bias voltage to the seventh transistor and the eighth transistor, the method 1100 may further comprise determining a desired gain of the apparatus. The method 1100 may subsequently comprise determining a desired back gate bias voltage that, when applied to the seventh transistor and the eighth transistor, imparts the desired gain to the apparatus. The method 1100 may further comprise fixing the fourth DC voltage source such that the back gate bias voltage provided to the seventh transistor and the eighth transistor is equal to the desired back gate bias voltage that imparts the desired gain to the apparatus.

Figure 12:
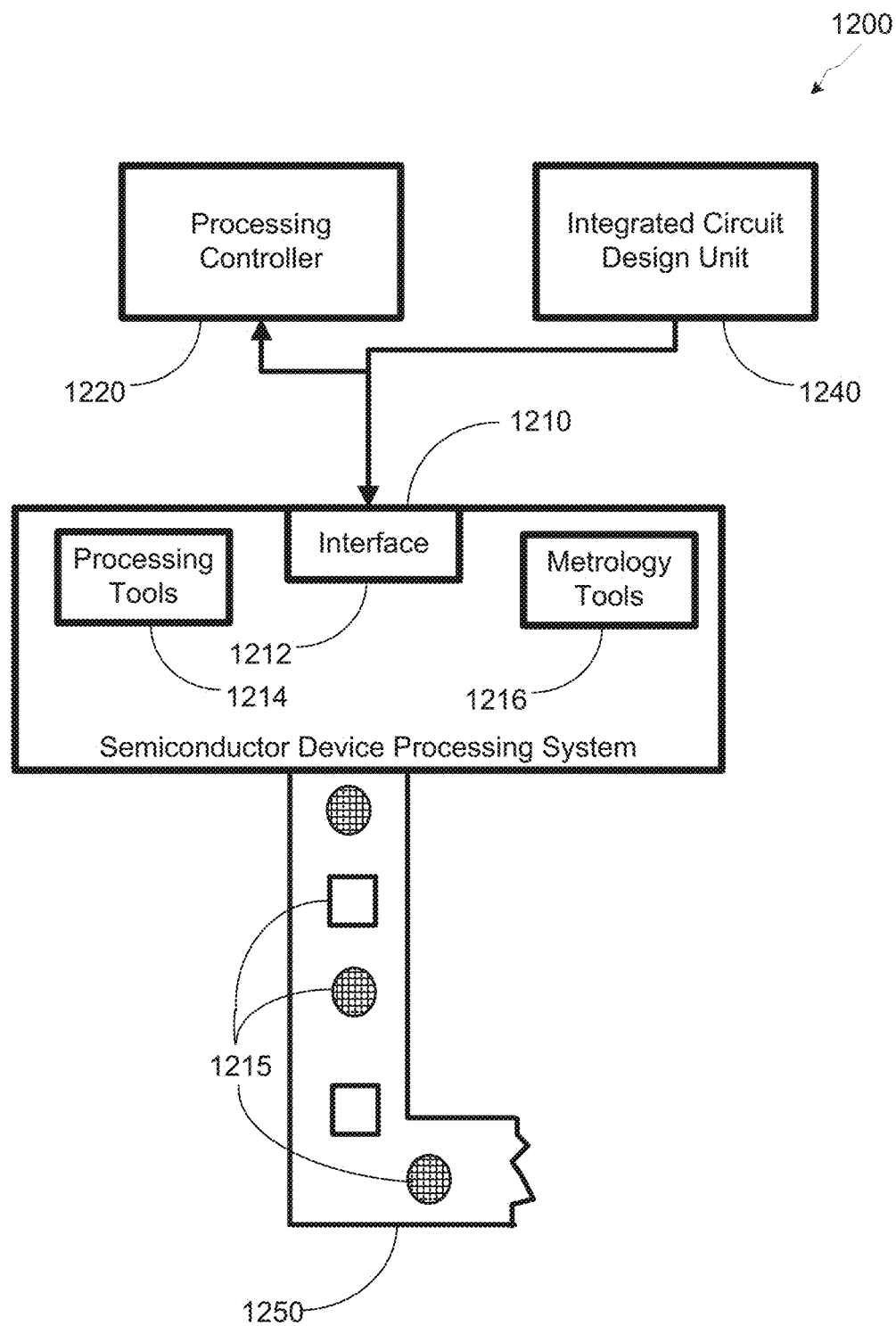
FIG. 12 illustrates a stylized depiction of a system for fabricating a semiconductor device, in accordance with embodiments herein.

Turning now to FIG. 12, a stylized depiction of a system 1200 for fabricating a semiconductor device package comprising power amplifier 900, 1000, in accordance with embodiments herein, is illustrated. A system 1200 of FIG. 12 may comprise a semiconductor device processing system 1210 and an integrated circuit design unit 1240. The semiconductor device processing system 1210 may manufacture integrated circuit devices based upon one or more designs provided by the integrated circuit design unit 1240.

The semiconductor device processing system 1210 may comprise various processing stations, such as etch process stations, photolithography process stations, CMP process stations, etc. Each of the processing stations may comprise one or more processing tools 1214 and or metrology tools 1216. Feedback based on data from the metrology tools 1216 may be used to modify one or more process parameters used by the processing tools 1214 for performing process steps.

The semiconductor device processing system 1210 may also comprise an interface 1212 that is capable of providing communications between the processing tools 1214, the metrology tools 1216, and a controller, such as the processing controller 1220. One or more of the processing steps performed by the semiconductor device processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. More particularly, the semiconductor device processing system 1210 may produce integrated circuits comprising a power amplifier as depicted in FIG. 9 or FIG. 10.

The production of integrated circuits by the semiconductor device processing system 1210 may be based upon the circuit designs provided by the integrated circuit design unit 1240. The semiconductor device processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may implement a plurality of processing steps, e.g., the steps of the method 1100 described above and depicted in FIG. 11.

In some embodiments, the items labeled "1215" may represent individual wafers, and in other embodiments, the items 1215 may represent a group of semiconductor wafers, e.g., a "lot" of semiconductor wafers. The integrated circuit or device 1215 may comprise a transistor, a capacitor, a resistor, a memory cell, a processor, and/or the like.

The integrated circuit design unit 1240 of the system 1200 is capable of providing a circuit design that may be manufactured by the semiconductor device processing system 1210. This may include information regarding whether a power amplifier as depicted in FIG. 9 or FIG. 10 is manufactured; which DC voltage is fixed for one or more DC voltage sources of the power amplifier; etc.

The integrated circuit design unit 1240 may be capable of determining the number of devices (e.g., processors, memory devices, etc.) to place in a device package. Based upon such details of the devices, the integrated circuit design unit 1240 may determine specifications of the devices that are to be manufactured. Based upon these specifications, the integrated circuit design unit 1240 may provide data for manufacturing a semiconductor device package described herein.

The system 1200 may be capable of performing analysis and manufacturing of various products involving various technologies. For example, the system 1200 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1200 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
an input transformer; and
an amplifier operatively coupled to the input transformer, the amplifier comprising:
a first differential transistor pair comprising a first transistor, a second transistor, and a first direct current (DC) voltage source configured to provide a first back gate bias voltage to the first transistor and to the second transistor, wherein the first back gate bias voltage is fixed; and
a second differential transistor pair comprising a third transistor, a fourth transistor, and a second DC voltage source configured to provide a second back gate bias voltage to the third transistor and to the fourth transistor, wherein the second back gate bias voltage is fixed;
wherein at least one of the first back gate bias voltage and the second back gate bias voltage is fixed at a voltage other than about 0 V; and
the first transistor, the second transistor, the third transistor, and the fourth transistor are each a fully depleted silicon on insulator (FDSOI) transistor.

2. The apparatus of claim 1, further comprising a neutralization cap comprising a fifth transistor, a sixth transistor, and a third DC voltage source, wherein the fifth transistor and the sixth transistor are cross-coupled, the fifth transistor is an NMOS transistor, the sixth transistor is an NMOS transistor, and the third DC voltage source is configured to provide a third back gate bias voltage to the fifth transistor and the sixth transistor; and
an output transformer.

3. The apparatus of claim 2, further comprising at least one stacked transistor pair, wherein each stacked transistor pair comprises a seventh transistor, an eighth transistor, and a fourth DC voltage source configured to provide a fourth back gate bias voltage to the seventh transistor and the eighth transistor.

4. The apparatus of claim 3, wherein the apparatus comprises two stacked transistor pairs.

5. The apparatus of claim 3, wherein first transistor, second transistor, third transistor, fourth transistor, fifth transistor, sixth transistor, seventh transistor, and eight transistor each comprise a front gate and a back gate configured to receive a back gate bias voltage.

6. The apparatus of claim 2, further comprising:
a harmonic trap.

7. An apparatus, comprising:
an input transformer capable of receiving a millimeter wave signal;
a power amplifier operatively coupled to the input transformer for amplifying the millimeter wave signal, the amplifier comprising:
a first differential circuit comprising a first transistor, a second transistor, and a first direct current (DC) voltage source configured to provide a first back gate bias voltage to the first transistor and to the second transistor, wherein the first back gate bias voltage is fixed; and
a second differential circuit comprising a third transistor, a fourth transistor, and a second DC voltage source configured to provide a second back gate bias voltage to the third transistor and to the fourth transistor, wherein the second back gate bias voltage is fixed; and an output transformer operatively coupled to the power amplifier, the output transformer capable of transmitting the amplified millimeter wave signal;

wherein at least one of the first back gate bias voltage and the second back gate bias voltage is fixed at a voltage other than about 0 V.

8. The apparatus of claim 7, further comprising a neutralization cap comprising a fifth transistor, a sixth transistor, and a third DC voltage source, wherein the fifth transistor and the sixth transistor are cross-coupled, the fifth transistor is a PMOS transistor, the sixth transistor is a PMOS transistor, and the third DC voltage source is configured to provide a third back gate bias voltage to the fifth transistor and the sixth transistor.

9. The apparatus of claim 8, further comprising at least one stacked transistor pair, wherein each stacked transistor pair comprises a seventh transistor, an eighth transistor, and a fourth DC voltage source configured to provide a fourth back gate bias voltage to the seventh transistor and the eighth transistor.

10. The apparatus of claim 9, wherein the apparatus comprises two stacked transistor pairs.

11. The apparatus of claim 8, further comprising:
a harmonic trap; and
two stacked transistor pairs, wherein each stacked transistor pair comprises a seventh transistor, an eighth transistor, and a fourth DC voltage source configured to provide a fourth back gate bias voltage to the seventh transistor and the eighth transistor.

12. The apparatus of claim 8, wherein the first transistor, the second transistor, the third transistor, the fourth transistor, the fifth transistor, and the sixth transistor are each an FDSOI transistor.

13. A method, comprising:
forming an apparatus comprising:
an input transformer; and
an amplifier operatively coupled to the input transformer, the amplifier comprising:
a first differential transistor pair comprising a first transistor, a second transistor, and a first direct current (DC) voltage source configured to provide a first back gate bias voltage to the first transistor and to the second transistor; and
a second differential transistor pair comprising a third transistor, a fourth transistor, and a second DC voltage source configured to provide a second back gate bias voltage to the third transistor and to the fourth transistor;
determining at least one of a desired bias point of the amplifier, a desired linearity of the amplifier, or a desired efficiency of the amplifier;
determining at least one of a desired first back gate bias voltage that, when applied to the first transistor and the second transistor, imparts the desired bias point to the amplifier, or a desired second back gate bias voltage that, when applied to the second transistor or the third transistor, imparts at least one of the desired linearity or the desired efficiency to the amplifier; and
fixing the first DC voltage source such that the first back gate bias voltage is equal to the desired first back gate bias voltage and the second DC voltage source such that the second back gate bias voltage is equal to the desired second back gate bias voltage, wherein at least one of the first back gate bias voltage and the second back gate bias voltage is fixed at a voltage other than about 0 V.

14. The method of claim 13, wherein the first DC voltage source provides a first back gate bias voltage of about 0.2 V, or the second DC voltage source provides a second back gate bias voltage of about 0 V.

15. The method of claim 13, wherein the first transistor, the second transistor, the third transistor, and the fourth transistor are each a fully depleted silicon on insulator (FDSOI) transistor.

16. The method of claim 13, further comprising:
forming the apparatus to comprise a neutralization cap comprising a fifth transistor, a sixth transistor, and a third DC voltage source, wherein the fifth transistor and the sixth transistor are cross-coupled, the fifth transistor is an NMOS transistor, the sixth transistor is an NMOS transistor, and the third DC voltage source is configured to provide a third back gate bias voltage to the fifth transistor and the sixth transistor; and
forming the apparatus to comprise an output transformer.

17. The method of claim 16, further comprising:
determining a desired capacitance of the neutralization cap;
determining a desired third back gate bias voltage that, when applied to the fifth transistor and the sixth transistor, imparts the desired capacitance to the neutralization cap; and
fixing the third DC voltage source such that the third back gate bias voltage is equal to the desired third back gate bias voltage.

18. The method of claim 17, wherein the apparatus further comprises:
at least one stacked transistor pair, wherein each stacked transistor pair comprises a seventh transistor, an eighth transistor, and a fourth DC voltage source configured to provide a fourth back gate bias voltage to the seventh transistor and the eighth transistor; and
the method further comprises:
determining a desired gain of the apparatus;
determining a desired back gate bias voltage that, when applied to the seventh transistor and the eighth transistor, imparts the desired gain to the apparatus; and
fixing the fourth DC voltage source such that the back gate bias voltage provided to the seventh transistor and the eighth transistor is equal to the desired back gate bias voltage that imparts the desired gain to the apparatus.

19. The method of claim 18, wherein the apparatus comprises two stacked transistor pairs.

* * * * *